(12) United States Patent
Iwamoto et al.

(10) Patent No.: US 7,700,531 B2
(45) Date of Patent: Apr. 20, 2010

(54) CLEANING AGENT

(75) Inventors: Hisahiko Iwamoto, Shunan (JP); Yoshifumi Inoue, Shunan (JP); Masaaki Nakashima, Shunan (JP); Masafumi Kasai, Shunan (JP)

(73) Assignee: Tokuyama Corporation, Shunan-shi (JP)

(*) Notice: Subject to any disclaimer, the term of this patent is extended or adjusted under 35 U.S.C. 154(b) by 0 days.

(21) Appl. No.: 11/793,384

(22) PCT Filed: Dec. 14, 2005

(86) PCT No.: PCT/JP2005/023419

§ 371 (c)(1),
(2), (4) Date: Jun. 18, 2007

(87) PCT Pub. No.: WO2006/064953

PCT Pub. Date: Jun. 22, 2006

(65) Prior Publication Data

US 2008/0153732 A1    Jun. 26, 2008

(30) Foreign Application Priority Data

Dec. 17, 2004   (JP)   .............................. 2004-366703

(51) Int. Cl.
*C11D 7/22* (2006.01)
(52) U.S. Cl. ....................... 510/162; 510/174; 510/175; 510/176; 510/461
(58) Field of Classification Search ................ 510/162, 510/461, 176, 175
See application file for complete search history.

(56) References Cited

U.S. PATENT DOCUMENTS

| | | | |
|---|---|---|---|
| 4,200,751 A * | 4/1980 | Ikegami et al. ................ 546/89 |
| 5,374,454 A * | 12/1994 | Bickford et al. ............. 427/306 |
| 5,612,303 A * | 3/1997 | Takayanagi et al. ......... 510/174 |
| 5,743,514 A | 4/1998 | Rees |
| 6,150,282 A * | 11/2000 | Rath et al. ................... 438/745 |
| 6,777,380 B2 * | 8/2004 | Small et al. .................. 510/176 |
| 6,943,142 B2 * | 9/2005 | Egbe et al. ................... 510/495 |
| 2003/0130146 A1 * | 7/2003 | Egbe et al. ................... 510/175 |
| 2003/0130149 A1 | 7/2003 | Zhou et al. |
| 2004/0266635 A1 * | 12/2004 | Korzenski et al. ........... 510/175 |
| 2005/0120491 A1 * | 6/2005 | Woerlee et al. ................ 8/142 |

FOREIGN PATENT DOCUMENTS

| | | |
|---|---|---|
| JP | 63-231343 A | 9/1988 |
| JP | 1-502059 A | 7/1989 |
| JP | 4-68094 A | 3/1992 |
| JP | 7-69619 B2 | 7/1995 |
| JP | 10-510002 A | 9/1998 |
| JP | 10-298587 A | 11/1998 |
| JP | 10-338897 A | 12/1998 |
| JP | 2003-297566 A | 10/2003 |
| JP | 2003-305421 A | 10/2003 |
| JP | 2003-332057 A | 11/2003 |
| JP | 2004-66155 A | 3/2004 |
| WO | WO-03/007085 A1 | 1/2003 |

\* cited by examiner

*Primary Examiner*—Mark Eashoo
*Assistant Examiner*—Mohammad Asdjodi
(74) *Attorney, Agent, or Firm*—Birch, Stewart, Kolasch & Birch, LLP

(57) ABSTRACT

There is provided a cleaning agent comprising a lactone represented by the following formula (1):

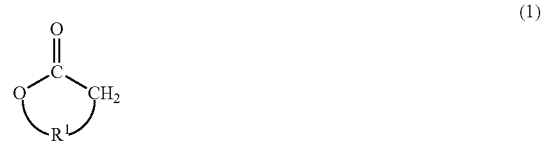

(1)

wherein $R^1$ is an alkylene group having 3 to 6 carbon atoms.

The cleaning agent is useful for cleaning an organic electroluminescence material, photosensitive resin, liquid crystal or wax.

3 Claims, No Drawings

CLEANING AGENT

FIELD OF THE INVENTION

This invention relates to a cleaning agent. More specifically, it relates to a cleaning agent used to clean an organic electroluminescence material, photosensitive resin, liquid crystal or wax.

BACKGROUND ART

An organic electroluminescence device (hereinafter also referred to simply as "organic EL device") is considered promising with respect to its use as a solid-state light-emitting, inexpensive, large-area full-color display device and is now under intense development. The organic EL device generally has a structure that an anode (ITO), a hole transport layer, an organic layer (luminescent layer), an electron transport layer and a cathode are laminated in this order on a transparent substrate such as a glass plate and a sealing can is placed on the surface. The above organic layer (luminescent layer), hole-injection layer, hole transport layer and electron transport layer (hereinafter also referred to simply as "organic layer and the like") contain organic EL device materials. As the organic EL device materials, low-molecular-weight materials such as copper phthalocyanine (CuPc), star-burst, bis(N-(1-naphthyl)-N-phenyl)benzidine, a beryllium-quinoline complex (Beq2), 4-methyl-8-hydroxyquinoline and a 3-(4-biphenylyl)-4-phenyl-5-(4-t-butylphenyl)-1,2,4-triazole molecule and high-molecular-weight materials such as poly (p-phenylenevinylene) and polyaniline are known.

In a production process of the organic EL device using the low-molecular-weight material as the organic EL material, the organic layer and the like are formed by vacuum-depositing the organic EL device material on a substrate having the anode layer, and the hole injection layer as required, formed thereon. When the organic layer and the like are formed by vacuum deposition, patterning is required for each pixel so as to display each color or control unwanted light emission. For this patterning, a metal mask having slits is used (refer to Japanese Patent Laid-Open Publication Nos. 2003-332057 and 2003-297566).

When the organic layer is formed in accordance with the above deposition technique, the organic EL device material adheres to a surface of the metal mask. When the metal mask continues to be used with the organic EL device material adhering thereon, the metal mask itself is deformed or the accumulated organic EL device material clogs the slits, with the result that high-precision patterning is no longer possible. Accordingly, to use the metal mask over and over, it must be cleaned on a regular basis to remove the organic EL device material adhering on its surface. As cleaning agents and cleaning methods which may be used for the above purpose, a method of wiping out the organic EL material by a hand using an organic solvent such as acetone, chloroform, isopropyl alcohol or methylene chloride and a method of washing out the organic EL material by using a supercritical fluid at high pressure are known, for example (refer to Japanese Patent Laid-Open Publication No. 2003-305421).

While the above method of cleaning the metal mask having the organic EL device material adhering thereon by use of a supercritical fluid has an advantage that recycling of the organic EL device material is possible, the method not only requires a pressure device but also has problems with respect to cleaning efficiency and operability.

Meanwhile, an automatic system can be built to clean an apparatus or article having the organic EL device material adhering thereon by use of a cleaning agent and is an industrially advantageous method as can be understood from a fact that it is used in many fields. However, cleaning using an organic solvent such as acetone, chloroform, isopropyl alcohol or methylene chloride is considered problematic with respect to environmental problems and safety on human bodies. Therefore, for cleaning an apparatus or article having the organic EL device material adhering thereon by use of a cleaning agent, it is necessary not to use an organic solvent which has an adverse effect on the environment and human bodies such as acetone, chloroform, isopropyl alcohol or methylene chloride but is necessary to find a cleaning agent having high detergency on the organic EL device material.

Meanwhile, a magnetic head device, a liquid crystal panel device or a semiconductor device such as an IC or LSI is formed by coating a resist on a conductive metal thin film or an insulation film such as an $SiO_2$ film or SiN film which is formed on a substrate, exposing the coated resist via a mask having a desired pattern formed thereon and developing the resist to form a resist pattern in a desired region, carrying out a treatment such as etching by use of the resist pattern as a mask and then removing the resist.

As a cleaning/removing agent for removing the above resist, an alkaline cleaning/removing agent comprising a water-soluble organic amine as an essential component has heretofore been used. As such a cleaning/removing agent, a resist stripping agent comprising (a) an amine such as monoethanolamine or ethylenediamine, (b) a polar solvent such as dimethyl sulfoxide or N-methyl-2-pyrrolidone and (c) a surfactant is known (refer to Japanese Patent Laid-Open Publication No. 63-231343), and the cleaning/removing agent shows excellent resist removability. However, in recent production of a magnetic head device, liquid crystal panel device and semiconductor device, the cleaning/removing agent is used at a high temperature of, for example, 80 to 90° C. in some cases, and in such a case, there is a problem that an insoluble matter which is difficult to remove even in a subsequent rinsing step is deposited on the surface of a cleaned object. In view of the above problem, a resist cleaning/removing agent comprising dimethyl sulfoxide and ethylenediamine has been proposed as a cleaning agent free of such a problem (refer to Japanese Patent Laid-Open Publication No. 11-133628). This cleaning agent does not have a problem that an insoluble matter is deposited on the surface of a cleaned object even when it is used at high temperatures and shows excellent resist removability. However, since the cleaning agent contains ethylenediamine which is highly irritating to the skin and eyes and has high sensitization, a safer cleaning agent has been desired.

Meanwhile, resist removing agents which do not comprise a water-soluble organic amine as an essential component are also known. Illustrative examples of such cleaning agents include a resist cleaning/removing agent comprising at least 50% by mass of dimethyl sulfoxide and 5 to 50% by mass of alcohol (refer to Japanese Patent Laid-Open Publication No. 63-163457) and a resist stripping agent comprising dimethyl sulfoxide, amino alcohol and water (refer to Japanese Patent Publication No. 7-69619).

These cleaning/removing agent and stripping agent show excellent resist removability. However, the former resist cleaning/removing agent has a problem of low flash point which limits its cleaning conditions and handling. Meanwhile, the latter resist stripping agent has a problem that it may cause corrosion of conductive film which may result in breaking of wires when a substrate having the conductive film formed thereon is used as an object to be cleaned, since the resist stripping agent contains water.

Recently, the material of conductive films has been shifted to aluminum and copper which are liable to corrode. They are susceptible to corrosion by water, and this disadvantage leads to a severe problem, i.e. a decrease in product yield. Further, although pyrrolidone typified by N-methyl-2-pyrrolidone, ketone typified by acetone and methyl ethyl ketone and methylene chloride have been widely used as components of cleaning agents because they exert high detergency, use of these materials tends to be avoided from the viewpoints of environmental problems and safety on human bodies.

DISCLOSURE OF THE INVENTION

An object of the present invention is to provide a cleaning agent which has high detergency and hardly causes adverse effects on human bodies and the environment.

Another object of the present invention is to provide a cleaning agent which makes it possible to build an automatic system, has high detergency on an organic EL device material and hardly causes adverse effects on human bodies and the environment.

Still another object of the present invention is to provide a cleaning agent which is suitably used for removing a photoresist remaining on a worked surface after a photolithography process in production of magnetic head device, liquid crystal panel device, semiconductor device or the like, causes no corrosion of conductive layer, causes no deposition of insoluble matter even when used at high temperatures and has high safety and resist removability.

Other objects and advantages of the present invention will become apparent from the following description.

According to the present invention, the above objects and advantages of the present invention are achieved by a cleaning agent comprising a lactone represented by the following formula (1):

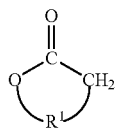

(1)

wherein $R^1$ is an alkylene group having 3 to 6 carbon atoms.

BEST MODE FOR CARRYING OUT THE INVENTION

The cleaning agent of the present invention contains a lactone represented by the above formula (1).

In the above formula (1), $R^1$ is an alkylene group having 3 to 6 carbon atoms. This alkylene group may be linear or branched, and illustrative examples thereof include —CH$_2$CH(CH$_3$)—, —(CH$_2$)$_3$—, —(CH$_2$)$_4$—, —(CH$_2$)$_5$—, —(CH$_2$)$_6$— and —CH$_2$CH$_2$CH(CH$_2$CH$_2$CH$_3$)—.

Illustrative examples of the lactone represented by the above formula (1) include δ-valerolactone, ε-caprolactone, ζ-enanthlactone, η-caprylolactone, and δ-propyl-δ-valerolactone. Of these, ε-caprolactone is preferred because it shows high detergency and safety and is easy to obtain.

These lactones can be used alone or in combination of two or more.

Further, these lactones can also be used as a mixture with other solvents soluble in the lactones, such as cyclic carbonate, glycol ether, hydrocarbon such as paraffin, isoparaffin or naphthene or dimethyl sulfoxide.

As the cyclic carbonate, a compound represented by the following formula (2):

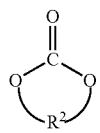

(2)

wherein $R^2$ is an alkylene group having 3 to 6 carbon atoms, is preferably used, for example.

In the above formula (2), the alkylene group $R^2$ having 3 to 6 carbon atoms may be linear or branched. Illustrative examples thereof include the same groups as those enumerated for $R^1$ in the formula (1).

Illustrative examples of the cyclic carbonate include propylene carbonate, glutaric anhydride, methyl glutaric anhydride, and glycerol 1,2-carbonate.

As the glycol ether, a compound represented by the following formula (3):

$$R^3O\text{-}(R^4O)_n\text{-}R^5 \quad (3)$$

wherein $R^3$ and $R^5$ are a hydrogen atom, an alkyl group having 1 to 4 carbon atoms, a phenyl group, an acetyl group or a propionyl group, $R^4$ is an alkylene group having 2 to 4 carbon atoms, and n is 1 to 3, with the proviso that $R^3$ and $R^5$ are not a hydrogen atom at the same time.

is preferably used, for example.

In the above formula (3), the alkyl group $R^3$ or $R^5$ having 1 to 4 carbon atoms and the alkylene group $R^4$ having 2 to 4 carbon atoms may be linear or branched. Illustrative examples of the alkyl group having 1 to 4 carbon atoms include methyl, ethyl, n-propyl, iso-propyl, n-butyl, tert-butyl, and sec-butyl. Illustrative examples of the alkylene group having 2 to 4 carbon atoms include ethylene, trimethylene, propylene, and tetramethylene.

Illustrative examples of the glycol ether represented by the above formula (3) include monopropylene glycol monomethyl ether, dipropylene glycol monomethyl ether, tripropylene glycol monomethyl ether, monopropylene glycol monopropyl ether, dipropylene glycol monopropyl ether, tripropylene glycol monopropyl ether, monopropylene glycol monobutyl ether, dipropylene glycol monobutyl ether, tripropylene glycol monobutyl ether, monopropylene glycol monophenyl ether, monopropylene glycol monomethyl ether acetate, monopropylene glycol monoethyl ether acetate, monoethylene glycol monomethyl ether, diethylene glycol monomethyl ether, triethylene glycol monomethyl ether, monoethylene glycol monopropyl ether, diethylene glycol monopropyl ether, triethylene glycol monopropyl ether, monoethylene glycol monobutyl ether, diethylene glycol monobutyl ether, triethylene glycol monobutyl ether, monopropylene glycol dimethyl ether, diethylene glycol methylethyl ether, triethylene glycol dimethyl ether, monopropylene glycol diacetate, diethylene glycol dimethyl ether, and diethylene glycol diethyl ether. These glycol ethers may be used alone or in admixture of two or more.

Of these, dipropylene glycol dimethyl ether, triethylene glycol dimethyl ether, dipropylene glycol monomethyl ether, tripropylene glycol monomethyl ether, dipropylene glycol monopropyl ether, tripropylene glycol monopropyl ether, monopropylene glycol monobutyl ether, dipropylene glycol monobutyl ether and tripropylene glycol monobutyl ether are suitable from the viewpoints of high detergency, low toxicity and physical properties which are easy to handle.

The above other solvent can be contained in an amount of preferably not larger than 80 wt %, more preferably not larger than 70 wt %, much more preferably not larger than 50 wt %, particularly preferably not larger than 30 wt %, based on the cleaning agent of the present invention.

Dimethyl sulfoxide as the above other solvent has a relatively high freezing point of 18.4° C. and may be difficult to use depending on the temperature of the atmosphere in which it is used. However, it is free of such an inconvenience when used as a mixture with a lactone and has such advantages that it exerts excellent detergency on a resist and an organic EL material, that it is easy to handle, that it has little adverse effect on a human body and that it has little possibility of causing fire. That is, as to the detergency of dimethyl sulfoxide, for example, it exerts an excellent removing performance on an organic EL material adhering to a mask, a crucible and the chamber of a vacuum deposition system which are used in producing a display using the organic EL material, and its removing performance on a resist is retained even when it is used at high temperatures, and it does not corrode a conductive film.

Dimethyl sulfoxide is used in an amount of preferably 40 to 80 wt %, more preferably 40 to 70 wt %, based on the cleaning agent of the present invention. When dimethyl sulfoxide and other solvent are used in combination, the solvent other than dimethyl sulfoxide is used in an amount of preferably 0.1 to 20 wt %, more preferably 1 to 10 wt %, based on the cleaning agent.

The cleaning agent of the present invention preferably contains as few impurities as possible. For example, since water causes a problem that it corrodes metal wires such as conductive wires and a metal pattern when an object to be cleaned which has these metals on a surface is cleaned with water, the amount thereof is preferably not larger than 1% by mass, particularly preferably not larger than 0.5% by mass. Further, the content of metals ions and the content of anions are preferably not higher than 100 ppb based on the mass of the cleaning agent.

The cleaning agent of the present invention may contain various stabilizers such as known antioxidants, e.g. butylhydroxyanisol and dibutylhydroxytoluene, as required. The content of the above stabilizer component is preferably 0 to 1,000 ppm, particularly preferably 0 to 100 ppm, based on the total mass of the cleaning agent.

The cleaning agent of the present invention can be advantageously used for cleaning of, for example, organic electroluminescence material, photosensitive resin, liquid crystal or wax.

The organic electroluminescence material (organic EL material) refers to an organic material used to produce an organic EL display.

Illustrative examples of the organic material include compounds used to form a hole injection/transport layer, a luminescent layer and an electron injection/transport layer. Specific examples of organic EL materials used in the hole injection/transport layer include bis(N-(1-naphthyl)-N phenyl)benzidine, bis(N-phenyl-N-tolyl)benzidine, oligoamine and spiroamine. Specific examples of organic EL materials used in the luminescent layer include a berylium-quinoline complex (Beq2), 4-methyl-8-hydroxyquinoline, N-methyl quinacridone, perylene, diphenyl naphthacene, and peryfuranten. Specific examples of organic materials used in the electron injection layer include 3-(4-biphenyl)-4-phenyl-5-(4-tert-butylphenyl)-1,2,4-triazole, phenanthroline compounds, silole compounds, perfluoro compounds, and quinoxaline compounds.

Objects to be cleaned are not particularly limited as long as they are apparatuses or articles to which the above organic EL materials adhere. Illustrative examples of these apparatuses or articles include a vacuum deposition system used in producing a display using the organic EL material, a metal mask used in depositing the organic EL material on a substrate, and a crucible for melting the organic EL material by heating. The vacuum deposition system is a system for depositing the organic EL material on a substrate in vacuum, and the system is classified into a resistance heating type, an electron beam heating type, a high-frequency induction heating type and a laser heating type according to a method of melting the organic EL material by heating but is not particularly limited.

When an object to be cleaned which has the organic EL material adhering thereon is cleaned by use of the cleaning agent of the present invention, a method therefor is not particularly limited, and the cleaning agent of the present invention can be used in the same manner as conventional cleaning agents to clean the object. For example, when the object to be cleaned is a metal mask, it is possible that the cleaning agent of the present invention is collected in a cleaning tank from which the cleaning agent does not leak to the outside and the metal mask is put in the tank to remove the adhering organic EL material, while when the object to be cleaned is a crucible, the adhering organic EL material may be wiped off by a cloth infiltrated with the cleaning agent of the present invention. In the case of the former, cleaning may be promoted by heating, ultrasonic or the like. The object to be cleaned may be rinsed with a highly volatile organic solvent such as isopropyl alcohol or hydrofluoroether after cleaned, and a drying line such as drying air may be provided to dry the cleaned object.

An example of the photosensitive material is a photoresist. Particularly, the cleaning agent of the present invention is the most effective for positive photoresists for a g ray, an i ray and an excimer laser. Specific examples of the resin include a novolak resin and a polyhydroxy styrene resin.

The cleaning agent of the present invention is generally used to remove these photoresists developed on substrates. Particularly, it exerts the most significant effect on substrates which have undergone development, baking and a treatment such as dry etching, e.g. reactive ion etching, or an ion implantation treatment. The substrates are not particularly limited, but a silicon wafer, glass and the like which have an insulation film such as $SiO_2$ or a conductive film such as Al, Cu, Si or an alloy thereof formed on the surface are generally used.

When the above objects to be cleaned are cleaned by use of the cleaning agent of the present invention, they can be cleaned in the same manner as when conventional cleaning agents are used except that the cleaning agent of the present invention is used. For example, the cleaning agent of the present invention is collected in a cleaning tank from which the cleaning agent does not leak to the outside, and an object to be cleaned is put in the tank to remove an adhering resist. At that time, cleaning may be promoted by heating, ultrasonic or the like. Although the cleaning agent of the present invention is effective even when used at room temperature, it is more effective when used in a heated state. In general, it is preferably used at 20 to 95° C. After removal of the resist by cleaning, a rinsing step such as rinsing with isopropyl alcohol (IPA) vapor is carried out as required, and the cleaned object is dried.

Similarly, an object to be cleaned which has liquid crystals adhering thereon, such as a liquid crystal cell and a liquid crystal panel, can be cleaned by use of the cleaning agent of the present invention.

In the present invention, a region (hollow portion) in which liquid crystals are enclosed is referred to as "liquid crystal cell", and one having such a liquid crystal cell as a constituent, e.g. one having a frame region in which wires and terminals are disposed in addition to the liquid crystal cell, is referred to as "liquid crystal panel", to differentiate the liquid crystal cell and the liquid crystal panel. However, in the present technical field, they are not differentiated, and one corresponding to the liquid crystal panel in the present invention may be referred to simply as a liquid crystal cell.

The cleaning agent of the present invention can remove liquid crystals adhering to a liquid crystal panel comprising a liquid crystal cell and exposed conductive members made of amphoteric metal or alloy comprising amphoteric metal. The liquid crystals are not particularly limited and are known liquid crystals such as STN liquid crystals and TN liquid crystals. Further, the amphoteric metal refers to at least one metal selected from the group consisting of Al, Zn, Pb and Sn. The alloy comprising amphoteric metal is not particularly limited as long as it is an alloy comprising these amphoteric metals and other metals and may be a solder alloy comprising these amphoteric metals, for example. Further, the conductive members refer to wires, electrodes, terminals, and a solder layer formed on the surfaces of the electrodes and terminals.

Due to its high cleaning effect, the cleaning agent of the present invention can be used to remove not only liquid crystals adhering to a general liquid crystal cell but also liquid crystals adhering to a liquid crystal cell having a gap portion (hereinafter also referred to as "specific gap portion") which has a gap width (w) of not larger than 5 µm and a ratio (w/d) of the width (w) to its depth (gap depth: d) of not larger than $1/20$, particularly, a gap between substrates of not larger than 5 µm and liquid crystals adhering to the gap portion of liquid crystal panel comprising amphoteric metal members. In particular, the cleaning agent of the present invention is suitably used for removing liquid crystals adhering to a liquid crystal panel comprising amphoteric metal members and having a specific gap portion.

A method of removing liquid crystals adhering to the liquid crystal cell or liquid crystal panel is not particularly limited as long as the above specific cleaning agent is used as a cleaning agent. For example, known cleaning methods such as a method comprising immersing the liquid crystal panel in the cleaning agent and irradiating the panel with ultrasonic, a method of immersing the liquid crystal panel in a flow such as a jet flow of the cleaning agent and a method of spraying the cleaning agent on the liquid crystal panel by a spray or the like can be employed without any restrictions.

In cleaning using the cleaning agent of the present invention, the cleaned liquid crystal cell or liquid crystal panel may be dried without rinsing. From the viewpoint of detergency, the cleaned liquid crystal cell or liquid crystal panel is preferably rinsed with a rinse agent comprising an organic solvent which dissolves the above cleaning agent or a fresh cleaning agent which has the same composition as that of the above cleaning agent. When water is used as a rinse agent, the amphoteric metal members may be corroded, and when an organic solvent other than the above rinse agent is used as a rinse agent, a large amount of the rinse agent is required because rinse efficiency is lowered.

Further, it is possible to clean an object to be cleaned which has wax adhering thereon by use of the cleaning agent of the present invention.

In the present invention, wax to be cleaned refers to wax used as a temporary adhesive for processing. Specific examples thereof include shellac, beeswax, natural resins such as rosin, thermoplastic resins, and petroleum wax.

When an article such as an optical component or an electronic component which is difficult to fix on a holder directly and process due to a reason that it is brittle, fine or thin is subjected to processing such as cutting, milling or polishing, these components are generally processed after secured on a holder such as a jig by use of the above wax. The processed article is separated from the holder by dissolving the wax by use of a cleaning agent. Since the cleaning agent of the present invention has high detergency on wax, it is suitably used as a cleaning agent in an article production method comprising such processing and separation steps, i.e. an article production method comprising a fixing step of fixing an article to be processed on a holder by use of wax, a processing step of subjecting the article fixed on the holder to cutting, milling, polishing or the like and a separation step of separating the processed article from the holder by removing the above wax by use of the cleaning agent.

The article to be processed in the above production method refers to an article which is subjected to processing such as cutting, milling or polishing. Illustrative examples of the article include optical articles such as an optical lens and a prism which are formed by transparent materials such as glass and quartz; articles which serve as constituents of the above optical articles; and articles which serve as materials or components of electronic products, such as a silicon wafer, a ceramic substrate and a crystal oscillator.

When these articles to be processed, particularly a fine component such as a crystal oscillator, are processed, the material is sliced to a given thickness, and a plurality of slices are joined together by use of wax and cut to a desired size. The cleaning agent of the present invention can also be suitably used in such a case to separate the joined articles after processing.

To separate the processed article from the holder or separate the joined articles from each other by use of the cleaning agent in the above separation step, the processed article (which is joined to the holder or another article by wax) is immersed in the cleaning agent collected in a cleaning tank and irradiated with ultrasonic as required. Since the cleaning agent of the present invention has extremely high detergency on wax, they can be completely separated in a short time.

Use of the cleaning agent of the present invention is not limited to production of optical article or electronic component. It can also be suitably used as a cleaning agent for cleaning a machine part which is polished with being fixed on a jig by wax after the machine part is polished or cleaning a mask for coating a resin or jigs so as to remove similar contaminants.

EXAMPLES

Hereinafter, the present invention will be further described with reference to examples. However, the present invention shall not be limited by these examples.

Example 1

To evaluate the detergency of cleaning agent, bis(N-(1-naphthyl)-N-phenyl)benzidine (α-NPD) (product of Dojindo Laboratories) as an organic electroluminescence material was vacuum-deposited to a thickness of 500 nm on a silicon wafer having a size of 1 cm×2 cm. Then, the silicon wafer having the organic electroluminescence material deposited thereon was immersed in 100 ml of ε-caprolactone at room temperature for 30 seconds to clean it. After cleaned, the silicon wafer was immersed in 100 ml of isopropyl alcohol at room temperature for 30 seconds and then rinsed. Then, to determine the amount of α-NPD remaining on the cleaned and rinsed silicon wafer, a peak area at 1,600 cm$^{-1}$ was measured by use of an infrared spectrophotometer (Spectrum One of PerkinElmer Japan Co., Ltd.) in accordance with a transmission method. When the peak area before cleaning was 100% and the peak area of silicon wafer having no organic electroluminescence material deposited thereon was 0%, the percentage of the α-NPD remaining on the cleaned and rinsed silicon wafer was not higher than 3% (not higher than the detection limit).

Example 2

When the detergency of cleaning agent was evaluated in the same manner as in Example 1 except that a cleaning agent obtained by mixing 1 volume of ε-caprolactone with 1 volume of dimethyl propylene diglycol was used in place of ε-caprolactone, the percentage of the α-NPD remaining on the cleaned and rinsed silicon wafer was not higher than 3% (not higher than the detection limit).

Example 3

When the detergency of cleaning agent was evaluated in the same manner as in Example 1 except that a cleaning agent obtained by mixing 6 volumes of ε-caprolactone with 4 volumes of propylene carbonate was used in place of ε-caprolactone, the percentage of the α-NPD remaining on the cleaned and rinsed silicon wafer was not higher than 3% (not higher than the detection limit).

Comparative Example 1

When the detergency of cleaning agent was evaluated in the same manner as in Example 1 except that normal paraffin was used as a cleaning agent in place of ε-caprolactone, the percentage of the α-NPD remaining on the cleaned and rinsed silicon wafer was 96%.

Comparative Example 2

When the detergency of cleaning agent was evaluated in the same manner as in Example 1 except that methyl propylene diglycol was used as a cleaning agent in place of ε-caprolactone, the percentage of the α-NPD remaining on the cleaned and rinsed silicon wafer was 86%.

Comparative Example 3

When the detergency of cleaning agent was evaluated in the same manner as in Example 1 except that acetone was used as a cleaning agent in place of ε-caprolactone, the percentage of the α-NPD remaining on the cleaned and rinsed silicon wafer was 80%.

Example 4

When the detergency of cleaning agent was evaluated in the same manner as in Example 1 except that tris(8-quinolinate)aluminum(III) (Alq3) was vacuum-deposited as an organic electroluminescence material in place of α-NPD, the percentage of the α-NPD remaining on the cleaned and rinsed silicon wafer was not higher than 3% (not higher than the detection limit).

Examples 5 to 8 and Comparative Examples 4 to 7

On a 4-inch silicon wafer having been subjected to RCA cleaning (which is a wet cleaning technique for Si substrates which has been developed by RCA Co., Ltd. and is based on ammonia/hydrogen peroxide solution cleaning (SC1) and hydrochloric acid/hydrogen peroxide solution cleaning (SC2)) and a treatment with hexamethyldisilazane (HMDS), a commercially available positive photoresist (THMR-iP3300 of Tokyo Ohka Kogyo Co., Ltd.) was coated to a thickness of 1 μm and then prebaked at 90° C. for 2 minutes. Then, after exposed to an i ray and developed, the silicon wafer was rinsed and postbaked at 150° C. for 30 minutes.

Test pieces were cut out of the silicon wafer subjected to the above treatments by a diamond cutter, and resist cleaning/removing agents having compositions shown in Table 1 were evaluated for resist cleaning/removing performance in the following manner. More specifically, a beaker having 10 ml of the resist cleaning/removing agent was placed in a hot bath and kept at 50° C., the above test piece having a size of 1 cm×1 cm was immersed in the beaker and taken out after 10 minutes, and its surface condition was observed visually and under a metaloscope. The results are shown in Table 1. Evaluations were made based on the following criteria.

○: The photoresist on the surface of the wafer was cleaned and removed completely.

Δ: The photoresist on the surface of the wafer partially remains.

X: The photoresist on the surface of the wafer was hardly removed.

Example 9

A cleaning/removing agent was evaluated in the same manner as in Example 5 except that the cleaning/removing agent was kept at 80° C. The results are shown in Table 1.

Comparative Example 8

A resist cleaning/removing agent having composition shown in Table 1 was evaluated in the same manner as in Example 5 except that the resist cleaning/removing agent was kept at 80° C. by placing a beaker having 10 ml of the resist cleaning/removing agent in a hot bath. The results are shown in Table 1.

Abbreviations used in Table 1 to refer to the materials used in Examples and Comparative Examples are as follows.

DMSO: dimethyl sulfoxide

ECL: ε-caprolactone

GVL: γ-valerolactone

2PM: dipropylene glycol monomethyl ether

PC: propylene carbonate

DEGME: diethylene glycol monomethyl ether

MEA: monoethanolamine

NBEA: N-n-butyl ethanolamine

PE61: NEWPOL PE61 (surfactant of Sanyo Chemical Industries, Ltd.)

DIW: ion exchange water

TABLE 1

| | Composition of Cleaning/removing Agent (weight ratio) | Cleaning Temperature (° C.) | Resist Removability | State of Corrosion | Adherence of Deposit | Remark |
|---|---|---|---|---|---|---|
| Ex. 5 | DMSO:ECL = 50:50 | 50 | ○ | Not Corroded | No | |
| Ex. 6 | DMSO:GVL = 40:60 | 50 | ○ | Not Corroded | No | |
| Ex. 7 | DMSO:ECL:2PM = 50:40:10 | 50 | ○ | Not Corroded | No | |
| Ex. 8 | DMSO:ECL = 50:50 | 15 | ○ | Not Corroded | No | |
| Ex. 9 | DMSO:ECL = 50:50 | 80 | ○ | Not Corroded | No | |
| C. Ex. 4 | DMSO:DEGME = 50:50 | 50 | Δ | Not Corroded | No | |
| C. Ex. 5 | DMSO:DEGME:MEA = 50:40:10 | 50 | Δ | Corroded | No | |
| C. Ex. 6 | DMSO:NBEA:DIW = 70:10:20 | 50 | Δ | Corroded | No | |
| C. Ex. 7 | DMSO = 100 | 15 | X | Not Corroded | No | Unable to clean due to coagulation of cleaning/removing Agent |
| C. Ex. 8 | MEA:DMSO:PE61 = 33:66:1 | 80 | ○ | Not Corroded | Yes | |

Ex.: Example,
C.Ex.: Comparative Example

Example 10

To evaluate the detergency of cleaning agent, copper phthalocyanine (product of Wako Pure Chemical Industries, Ltd.) as an organic EL material was vacuum-deposited to a thickness of 500 nm on a silicon wafer having a size of 1 cm×2 cm. Then, the silicon wafer having the organic EL material deposited thereon was immersed in a cleaning agent comprising 50 g of ε-caprolactone and 50 g of dimethyl sulfoxide at 15° C. for 3 minutes to clean it. After cleaned, the silicon wafer was immersed in 100 ml of isopropyl alcohol at room temperature for 30 seconds and then rinsed. Then, to determine the amount of copper phthalocyanine remaining on the cleaned and rinsed silicon wafer, a peak area at 1,600 cm$^{-1}$ was measured by use of an infrared spectrophotometer (Spectrum One of PerkinElmer Japan Co., Ltd.) in accordance with a transmission method. When the peak area before cleaning was 100% and the peak area of silicon wafer having no organic EL material deposited thereon was 0%, the percentage of the copper phthalocyanine remaining on the cleaned and rinsed silicon wafer was not higher than 3% (not higher than the detection limit).

Example 11

When the detergency of cleaning agent was evaluated in the same manner as in Example 10 except that a cleaning agent comprising 30 g of ε-caprolactone and 70 g of dimethyl sulfoxide was used, the percentage of the copper phthalocyanine remaining on the cleaned and rinsed silicon wafer was not higher than 3% (not higher than the detection limit).

Example 12

When the detergency of cleaning agent was evaluated in the same manner as in Example 10 except that a cleaning agent comprising 80 g of ε-caprolactone and 20 g of dimethyl sulfoxide was used, the percentage of the copper phthalocyanine remaining on the cleaned and rinsed silicon wafer was 5%.

Example 13

When the detergency of cleaning agent was evaluated in the same manner as in Example 10 except that a cleaning agent comprising 70 g of ε-caprolactone, 20 g of dimethyl sulfoxide and 10 g of dipropylene glycol monomethyl ether was used, the percentage of the copper phthalocyanine remaining on the cleaned and rinsed silicon wafer was 6%.

Comparative Example 9

When the detergency of cleaning agent was evaluated in the same manner as in Example 10 except that 100% of dimethyl sulfoxide was used as a cleaning agent, cleaning could not be performed due to coagulation of dimethyl sulfoxide.

Comparative Example 10

When the detergency of cleaning agent was evaluated in the same manner as in Example 10 except that acetone was used as a cleaning agent, the percentage of the copper phthalocyanine remaining on the cleaned and rinsed silicon wafer was 100%.

Example 14

When the detergency of cleaning agent was evaluated in the same manner as in Example 10 except that tris(8-hydroxyquinolinate)aluminum(III) (Alq3) was vacuum-deposited as an organic EL material in place of copper phthalocyanine, the percentage of the Alq3 remaining on the cleaned and rinsed silicon wafer was not higher than 3% (not higher than the detection limit).

Example 15

When the detergency of cleaning agent was evaluated in the same manner as in Example 10 except that (N-(1-naphthyl)-N-phenyl)benzidine (α-NPD) was vacuum-deposited as an organic EL material in place of copper phthalocyanine, the percentage of the α-NPD remaining on the cleaned and rinsed silicon wafer was not higher than 3% (not higher than the detection limit).

Examples 16 to 19 and Comparative Examples 11 to 13

A liquid crystal panel (50 mm×50 mm, gap width: 2.5 μm, gap depth: 100 μm, w/d=1/40) comprising a liquid crystal cell having a liquid crystal inlet and 100 exposed aluminum terminals was prepared, STN liquid crystals were injected into the liquid crystal cell through the liquid crystal inlet and the liquid crystal inlet was then sealed to obtain a liquid crystal panel having excessive liquid crystals adhering on the surface and in a gap between two opposed glass plates constituting the liquid crystal cell.

Cleaning agents having compositions shown in Table 2 were prepared to evaluate their detergency. Numbers in the compositions of the cleaning agents are presented in a weight ratio.

1,000 ml of the prepared cleaning agent was kept at 40° C., and the liquid crystal cell was immersed therein and ultrasonic-cleaned for 2 minutes. After the liquid crystal cell was drawn out of the cleaning agent slowly, it was blown by hot air of 40° C. for 10 minutes to be dried.

Then, the surface and gap portion of the liquid crystal cell were observed under a polarization microscope, and the detergency of the cleaning agent was evaluated based on the amount of remaining liquid crystals. Further, the state of corrosion of the aluminum terminals was examined, and the influence of each cleaning agent on aluminum was evaluated. The results are shown in Table 2. Detergency was evaluated on the following scale of 1 to 5.

Evaluation Criteria

5: No liquid crystals remain in the gap portion and on the surface.

4: No liquid crystals remain on the surface, but a slight amount of liquid crystals remain in the gap portion.

3: No liquid crystals remain on the surface, but a substantial amount of liquid crystals remain in the gap portion.

2: Liquid crystals in the gap portion could hardly be removed, and a slight amount of liquid crystals remain on the surface.

1: Liquid crystals adhering on the surface could hardly be removed.

Abbreviations in Table 2 refer to the following components.

CL: ε-caprolactone

BL: γ-butyrolactone

2PM: dipropylene glycol monomethyl ether

PC: propylene carbonate

NP: normal paraffin

DIW: ion exchange water

EAC: monoethanolamine caprate

NS: polyoxyethylene laurylether (nonionic surfactant)

TABLE 2

| | Composition of Cleaning/removing Agent (weight ratio) | Detergency | Corrosion of Terminals |
|---|---|---|---|
| Ex. 16 | CL = 100 | 5 | Not Corroded |
| Ex. 17 | BL = 100 | 5 | Not Corroded |
| Ex. 18 | CL:2PM = 50:50 | 5 | Not Corroded |
| Ex. 19 | CL:PC = 60:40 | 5 | Not Corroded |
| C. Ex. 11 | NP = 100 | 2 | Not Corroded |
| C. Ex. 12 | 2PM = 100 | 3 | Not Corroded |
| C. Ex. 13 | EAC:NS:DIW = 20:10:70 | 2 | Corroded |

Ex.: Example,
C.Ex.: Comparative Example

Example 20

When about 0.1 g of CS WAX of KOKONOE ELECTRIC CO., LTD. was coated on a glass slide and the coated glass slide was immersed in ε-caprolactone kept at 40° C. for 1 hour, the wax was completely dissolved.

Example 21

The procedure of Example 20 was repeated except that a cleaning agent (content of ε-caprolactone: 26.4% by mass) obtained by mixing 8 volumes of ε-caprolactone with 2 volumes of dipropylene glycol dimethyl ether was used in place of ε-caprolactone. The sample was completely dissolved.

Example 22

The procedure of Example 20 was repeated except that SHIFTWAX 6406 of NIKKA SEIKO CO., LTD. was used in place of CS WAX. The sample was completely dissolved.

Comparative Example 14

The procedure of Example 20 was repeated except that normal paraffin was used in place of ε-caprolactone and the sample was immersed at 40° C. for 8 hours. The sample was hardly dissolved.

Comparative Example 15

The procedure of Example 20 was repeated except that normal paraffin was used in place of ε-caprolactone and the sample was immersed at 40° C. for 8 hours. The sample was hardly dissolved.

Comparative Example 16

The procedure of Example 20 was repeated except that dipropylene glycol dipropyl ether was used in place of ε-caprolactone and the sample was immersed at 40° C. for 8 hours. The sample was hardly dissolved.

The invention claimed is:

1. A cleaning agent which may contain water as an impurity, said cleaning agent consisting of:

(i) a lactone represented by the following formula (1):

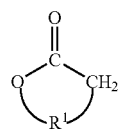

(1)

wherein $R^1$ is an alkylene group having 3 to 6 carbon atoms, and (ii) at least one other solvent selected from the group consisting of a cyclic carbonate represented by the following formula (2):

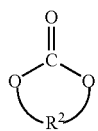 (2)

wherein $R^2$ is an alkylene group having 3 to 6 carbon atoms, a glycol ether represented by the following formula (3):

 (3)

wherein $R^3$ and $R^5$ are a hydrogen atom, an alkyl group having 1 to 4 carbon atoms, a phenyl group, an acetyl group or a propionyl group, $R^4$ is an alkylene group having 2 to 4 carbon atoms, and n is 1 to 3, with the proviso that $R^3$ and $R^5$ are not a hydrogen atom at the same time, and a dimethyl sulfoxide, wherein said at least one other solvent is present in an amount of not more than 80% by mass based on the cleaning agent, and said cleaning agent contains not more than 1% by mass of water, said cleaning agent optionally containing a stabilizer, and optionally containing metal ions in an amount not higher than 100 ppb based on the mass of the cleaning agent, and optionally containing anions in an amount not higher than 100 ppb based on the mass of the cleaning agent.

2. The cleaning agent of claim 1, wherein said cleaning agent contains not more than 0.5% by mass of water.

3. The cleaning agent of claim 1, wherein said stabilizer is present and is an antioxidant.

* * * * *